(12) United States Patent
Inoue et al.

(10) Patent No.: US 11,990,890 B2
(45) Date of Patent: May 21, 2024

(54) RESONATOR AND RESONANCE DEVICE INCLUDING SAME

(71) Applicant: Murata Manufacturing Co., Ltd., Nagaokakyo (JP)

(72) Inventors: Yoshihisa Inoue, Nagaokakyo (JP); Ryota Kawai, Nagaokakyo (JP); Yuichi Goto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 654 days.

(21) Appl. No.: 17/181,336

(22) Filed: Feb. 22, 2021

(65) Prior Publication Data

US 2021/0203304 A1     Jul. 1, 2021

Related U.S. Application Data

(63) Continuation of application No. PCT/JP2019/017254, filed on Apr. 23, 2019.

(30) Foreign Application Priority Data

Sep. 13, 2018   (JP) .................................. 2018-171820

(51) Int. Cl.
*H03H 9/24* (2006.01)
*H03H 9/02* (2006.01)
(Continued)

(52) U.S. Cl.
CPC ...... *H03H 9/2489* (2013.01); *H03H 9/02259* (2013.01); *H03H 9/02448* (2013.01); *H03H 9/08* (2013.01); *H03H 9/1057* (2013.01)

(58) Field of Classification Search
CPC .. H03H 9/02559; H03H 9/02448; H03H 9/08; H03H 9/1057
See application file for complete search history.

(56) References Cited

U.S. PATENT DOCUMENTS

| 10,673,404 B2 | 6/2020 | Hirota |
| 10,749,496 B2 | 8/2020 | Yoshii et al. |

(Continued)

FOREIGN PATENT DOCUMENTS

| CN | 107534432 A | 1/2018 |
| JP | 2010232932 A | 10/2010 |

(Continued)

OTHER PUBLICATIONS

Written Opinion of the International Search Authority issued for PCT/JP2019/017254, date of mailing Jul. 16, 2019.

(Continued)

*Primary Examiner* — Bryan P Gordon
(74) *Attorney, Agent, or Firm* — Arentfox Schiff LLP

(57) ABSTRACT

A resonator includes a base; and at least three vibrating arms having first ends connected to a front end of the base and second ends that are open ends spaced away from the front end. Each vibrating arm includes an arm portion having a part that extends from the fixed end in a direction toward the open end with a constant width and a mass-adding portion that is connected to a tip of the arm portion and has a larger width than the arm portion. An interval between the mass-adding portions is larger than an interval between the arm portions for any two vibrating arms that are adjacent to each other.

20 Claims, 9 Drawing Sheets

(51) Int. Cl.
   *H03H 9/08* (2006.01)
   *H03H 9/10* (2006.01)

(56) References Cited

U.S. PATENT DOCUMENTS

| | | |
|---|---|---|
| 2011/0227659 A1 | 9/2011 | Tanaya |
| 2015/0022274 A1* | 1/2015 | Yamazaki ............ C23C 14/0688 |
| | | 204/192.18 |
| 2016/0072473 A1 | 3/2016 | Nishimura |
| 2016/0233847 A1* | 8/2016 | Yamada ................... H03B 5/30 |
| 2018/0034441 A1 | 2/2018 | Hirota et al. |
| 2018/0175824 A1 | 6/2018 | Hirota |
| 2019/0097600 A1 | 3/2019 | Yoshii et al. |

FOREIGN PATENT DOCUMENTS

| | | |
|---|---|---|
| JP | 2011199332 A | 10/2011 |
| JP | 5509647 B2 | 6/2014 |
| JP | 2016133427 A | 7/2016 |
| WO | 2014185282 A1 | 11/2014 |
| WO | 2017047207 A1 | 3/2017 |
| WO | 2017208568 A1 | 7/2017 |

OTHER PUBLICATIONS

2 International Search Report issued for PCT/JP2019/017254, date of mailing Jul. 16, 2019.

* cited by examiner

RESONATOR AND RESONANCE DEVICE INCLUDING SAME

CROSS REFERENCE TO RELATED APPLICATIONS

The present application is a continuation of PCT/JP2019/017254 filed Apr. 23, 2019, which claims priority to JP Application No. 2018-171820, filed Sep. 13, 2018, the entire contents of each of which are incorporated herein by reference.

TECHNICAL FIELD

The present invention relates to a resonator and to a resonance device that includes a resonator.

BACKGROUND ART

Resonance devices, which are a type of micro-electromechanical system (MEMS), are currently incorporated into electronic devices such as smartphones, as a timing device, for example. These types of resonance device, for example, include a bottom cover, a top cover that forms a cavity together with the bottom cover, and a resonator that is arranged inside the cavity between the bottom cover and the top cover. The resonator includes, for example, a piezoelectric film, an upper electrode and a lower electrode provided with the piezoelectric film interposed therebetween, and an insulating film provided between the layers or on the surface of the resonator.

As an example of a specific configuration of such a resonator, for example, Patent Document 1 (identified below) discloses a resonator that includes a first electrode and a second electrode, a piezoelectric film provided between the first electrode and the second electrode. Moreover, a protective film composed of an insulator is provided on the first electrode, and a conductive film composed of a conductor is provided on the protective film. The conductive film is electrically connected to either one of the first electrode and the second electrode.

In addition, Patent Document 2 (also identified below) discloses a tuning-fork resonator that includes a pair of vibrating arms that extend from a base portion and vibrate in an in-plane bending vibration mode. The vibrating arms each include an arm portion of a prescribed width that is connected to the base portion and a wide mass-adding portion provided at a tip portion of the arm portion. The mass-adding portions each have a part that protrudes from a side surface of the arm portion only in the width direction on the opposite side from the other vibrating arm.

In addition, Patent Document 3 (identified below) discloses a resonator that includes inner vibrating arms and outer vibrating arms that extend parallel to each other from a base portion. Each vibrating arm includes a fixed end connected to the base portion and an open end where a mass-adding portion is formed. Facing side surfaces of an outer vibrating arm and an inner vibrating arm that are adjacent to each other are planar surfaces and the side surfaces on the opposite side from the facing side surfaces protrude in the mass-adding portions.

Patent Document 1: International Publication No. 2017/208568.
Patent Document 2: Japanese Patent No. 5509647.
Patent Document 3: International Publication No. 2017/047207.

In the resonators described in these documents, it is known that when an insulator or conductor provided on a surface or between layers becomes charged due to ion beam sputtering or the pyroelectric effect, an attractive or repulsive force may act on the resonator due to Coulomb forces and consequently the resonant frequency of the resonator may vary. This effect due to Coulomb forces is more pronounced in a configuration that includes vibrating arms that are adjacent to each other and vibrate with opposite phases from each other.

Regarding this point, the charge with which the conductive film is charged in the resonator disclosed in Patent Document 1 can be released to some extent, but the area where the conductive film is provided may be limited, and the effect of the Coulomb force may not be sufficiently eliminated. In addition, in the resonators disclosed in Patent Documents 2 and 3, the effect of Coulomb forces due to the charge with which an insulating film or an insulated conductive film is charged is not specifically taken into account.

SUMMARY OF THE INVENTION

The exemplary embodiments of the present invention are provided in light of the above-described circumstances. It is an object thereof to provide a resonator that suppresses variations in resonant frequency without compromising mechanical strength.

According to an exemplary aspect, a resonator is provided that includes a base; and at least three vibrating arms that include a piezoelectric film and an upper electrode and a lower electrode that are provided so as to face each other with the piezoelectric film interposed therebetween. Moreover, first ends of the vibrating arms are fixed ends connected to a front end of the base and second ends of the vibrating arms are open ends spaced away from the front end. Each vibrating arm includes an arm portion having a part that extends from the fixed end in a direction toward the open end with a constant width and a mass-adding portion (or weight) that is connected to a tip of the arm portion and has a larger width than the arm portion. An interval between the mass-adding portions is larger than an interval between the arm portions for any two vibrating arms, among the at least three vibrating arms, that are adjacent to each other and vibrate with opposite phases.

According to the present invention, a resonator is provided that suppresses variations in resonant frequency without compromising mechanical strength. Moreover, a resonance device is provided that includes the resonator.

DETAILED DESCRIPTION OF EMBODIMENTS

Figure 1:
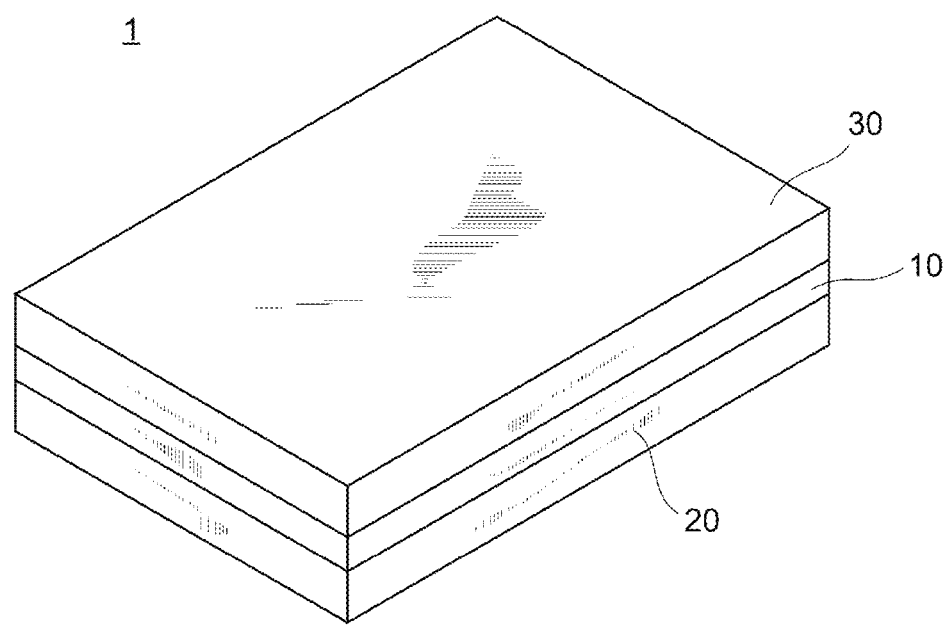
FIG. 1 is a perspective view schematically illustrating the exterior of a resonance device according to a first exemplary embodiment.
Figure 1:
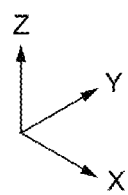

Hereafter, exemplary embodiments of the present invention will be described while referring to the drawings. In the following description of the drawings, identical or similar constituent elements are denoted by identical or similar reference symbols. The drawings are representative, the dimensions and shapes of the individual parts are schematically illustrated, and the technical scope of the present invention should not be interpreted as being limited to that of the embodiments.

First Exemplary Embodiment

Figure 2:
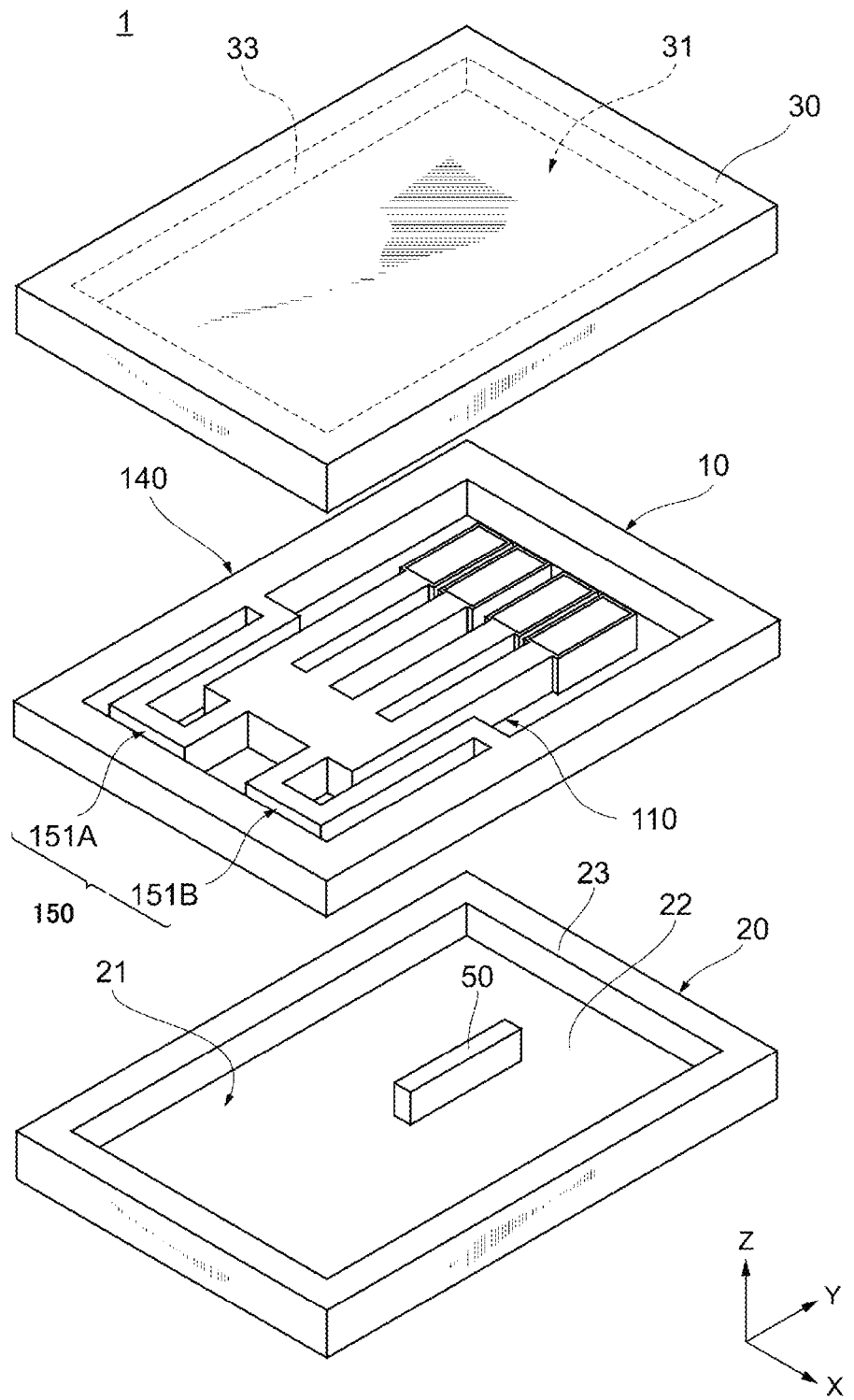
FIG. 2 is an exploded perspective view schematically illustrating the structure of the resonance device according to the first exemplary embodiment.

First, the configuration of a resonance device 1 according to a first exemplary embodiment will be described while referring to FIGS. 1 and 2. FIG. 1 is a perspective view schematically illustrating the exterior of the resonance device according to the first exemplary embodiment. FIG. 2 is an exploded perspective view schematically illustrating the structure of the resonance device according to the first exemplary embodiment.

(Resonance Device 1)

As shown, the resonance device 1 includes a resonator 10 and a bottom cover 20 and a top cover 30 provided so as to face each other with the resonator 10 interposed therebetween. The bottom cover 20, the resonator 10, and the top cover 30 are stacked in this order in a Z-axis direction. In an exemplary aspect, the resonator 10 and the bottom cover 20 are bonded to each other and the resonator 10 and the top cover 30 are bonded to each other. A vibration space of the resonator 10 is formed between the bottom cover 20 and the top cover 30, which are bonded to each other with the resonator 10 interposed therebetween. The resonator 10, the bottom cover 20, and the top cover 30 are formed using substrates that can be processed using microfabrication techniques, such as semiconductor substrates, glass substrates, and organic substrates.

Hereafter, the configuration of each part of the resonance device 1 will be described. It is noted that in the following description, the side of the resonance device 1 where the top cover 30 is provided is referred to as "top" (or "front") and the side of the resonance device 1 where the bottom cover 20 is provided is referred to as "bottom" (or "rear").

In an exemplary aspect, the resonator 10 is a MEMS vibrator manufactured using MEMS techniques. The resonator 10 includes a vibrating portion 110 (or vibrator), a holding portion 140 (or frame), and a holding arm 150. The vibrating portion 110 is held in the vibration space. In operation, the vibration mode of the vibrating portion 110 is not limited to and is, for example, an out-of-plane bending vibration mode with respect to the XY plane, but may instead be an in-plane bending vibration mode with respect to the XY plane. The holding portion 140, for example, has a rectangular frame shape that surrounds the vibrating portion 110. The holding arm 150 connects the vibrating portion 110 and the holding portion 140 to each other.

The bottom cover 20 includes a rectangular flat plate shaped bottom plate 22, which is provided along the XY plane, and a side wall 23 that extends from the periphery of the bottom plate 22 in the Z-axis direction. The side wall 23 is bonded to the holding portion 140 of the resonator 10. A recess 21, which is formed by the front surface of the bottom plate 22 and the inner surface of the side wall 23, is formed on the surface of the bottom cover 20 that faces the vibrating portion 110 of the resonator 10. The recess 21 is a rectangular parallelepiped shaped opening that opens upwardly and forms part of the vibration space of the resonator 10. On the inner surface of the bottom cover 20, a protrusion 50, which protrudes into the vibration space, is formed on the front surface of the bottom plate 22.

The structure of the top cover 30 is symmetrical with the structure of the bottom cover 20 with respect to the resonator 10. In other words, the top cover 30 includes a rectangular flat plate shaped bottom plate 32 provided along the XY plane and a side wall 33 that extends from the periphery of the bottom plate 32 in the Z-axis direction, and the side wall 33 is bonded to the holding portion 140 of the resonator 10. A recess 31 is formed in the top cover 30 on a surface that faces the vibrating portion 110 of the resonator 10. The recess 31 is a rectangular parallelepiped shaped opening that opens downward and forms part of the vibration space of the resonator 10.

The structure of the bottom cover 20 and the structure of the top cover 30 are not limited to this example, and the structures may instead be non-symmetrical with each other, for example. For example, one of either of the bottom cover 20 and the top cover 30 may have a dome-like shape. The shapes of the recess 21 of the bottom cover 20 and the recess 31 of the top cover 30 may be different from each other, and for example, the depths of the recess 21 and the recess 31 may be different from each other.

(Resonator 10)

Figure 3:
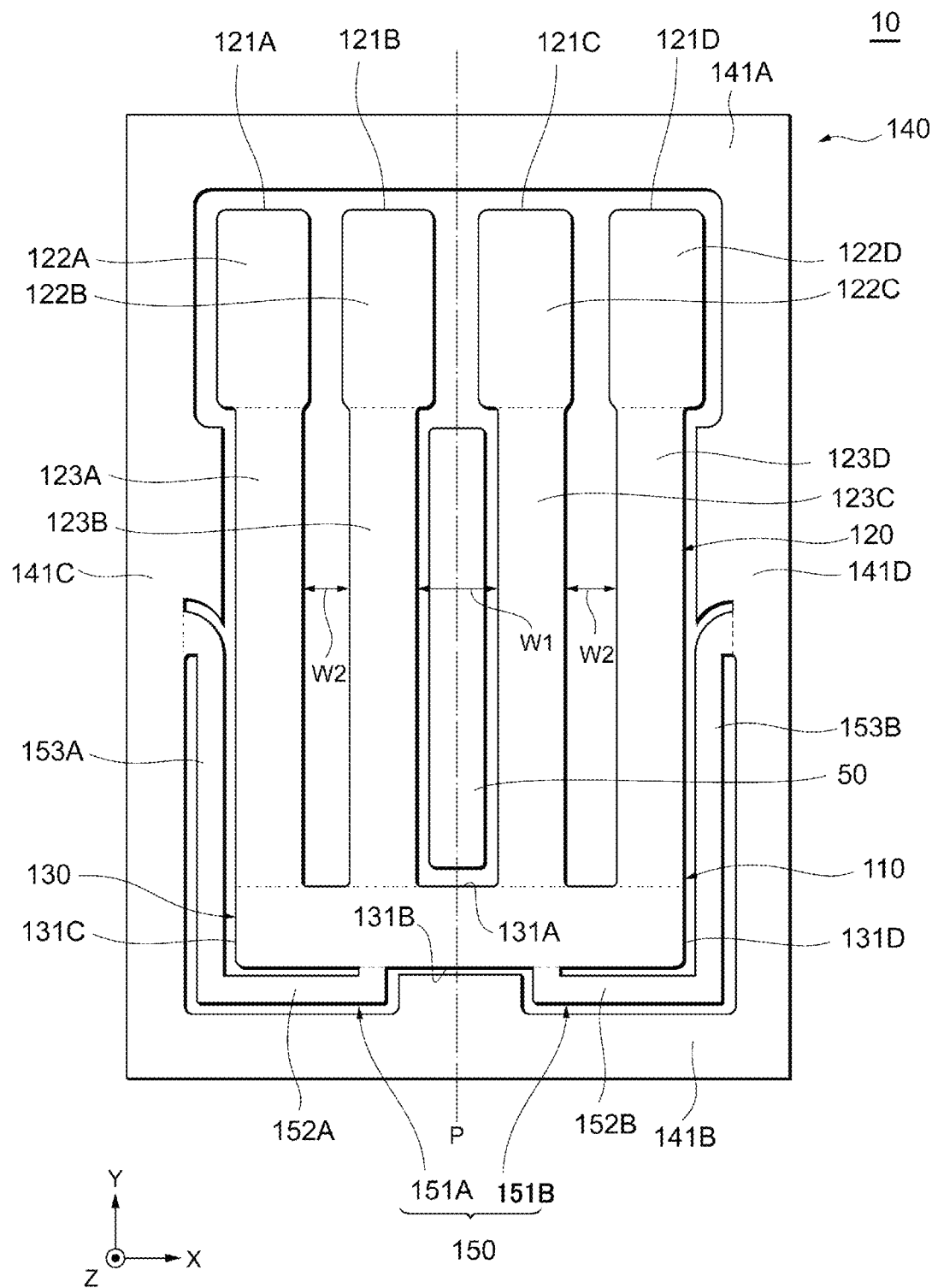
FIG. 3 is a plan view schematically illustrating the structure of a resonator according to the first exemplary embodiment.

Next, the configurations of the vibrating portion 110, the holding portion 140, and the holding arm 150 of the resonator 10 according to the exemplary embodiment will be described in detail while referring to FIG. 3. FIG. 3 is a plan view schematically illustrating the structure of the resonator according to the first exemplary embodiment.

(Vibrating Portion 110)

The vibrating portion 110 is provided inside the holding portion 140 (or frame) in a plan view from the top cover 30 side. A space is formed between the vibrating portion 110 and the holding portion 140 with a predetermined spacing. The vibrating portion 110 includes an excitation portion 120 that, in the exemplary aspect, includes four vibrating arms 121A, 121B, 121C, and 121D and a base 130 that is connected to the excitation portion 120. It is noted that the number of vibrating arms is not limited to four and three or more vibrating arms can be provided in alternative embodiments. In this embodiment, the excitation portion 120 and the base 130 are formed so as to be integrated with each other.

(Vibrating Arms 121A to 121D)

The vibrating arms 121A, 121B, 121C, and 121D extend in the Y-axis direction (i.e., a lengthwise direction) and are provided parallel to each other in this order with a prescribed spacing therebetween in the X-axis direction (i.e., a widthwise direction). One end of the vibrating arm 121A is a fixed end that is connected to a front end portion 131A (or simply front end) of the base 130, which is described later, and the other end of the vibrating arm 121A is an open end that is provided so as to be spaced away from the front end portion 131A of the base 130. The vibrating arm 121A includes a mass-adding portion 122A (or weight) that is formed at the open end side and an arm portion 123A that extends from the fixed end and is connected to the mass-adding portion 122A. Similarly, the vibrating arms 121B, 121C, and 121D respectively include mass-adding portions 122B, 122C, and 122D and arm portions 123B, 123C, and 123D. The arm portions 123A to 123D each have, for example, a width of around 50 μm in the X-axis direction and a length of around 450 μm in the Y-axis direction.

Among the four vibrating arms, the vibrating arms 121A and 121D are outer vibrating arms that are arranged on the outside in the X-axis direction and the vibrating arms 121B and 121C are inner vibrating arms that are arranged on the inside in the X-axis direction. As an example, a width (hereafter referred to as a "release width") W1 of a gap formed between the arm portions 123B and 123C of the inner vibrating arms 121B and 121C is set so as to be larger than a release width W2 formed between the arm portions 123A and 123B of the outer vibrating arm 121A and the inner vibrating arm 121B, which are adjacent to each other in the X-axis direction, and so as to be larger than a release width W2 formed between the arm portions 123D and 123C of the outer vibrating arm 121D and the inner vibrating arm 121C, which are adjacent to each other in the X-axis direction. The vibration characteristics and durability are improved by setting the release width W1 to be larger than the release width W2 in this way. The numerical values of the release widths W1 and W2 are not restricted, and for example, the release width W1 is around 25 μm and the release width W2 is around 10 μm according to an exemplary aspect. It is noted that the release width W1 between the arm portions of the inner vibrating arms and the release width W2 between the arm portions of an inner vibrating arm and an outer vibrating arm are not limited to being configured in the manner illustrated in FIG. 3, and alternatively, the release width W1 may be set so as to be smaller than the release width W2 or both widths may be set to be equal to each other in alternative aspects.

The width of each of the mass-adding portions 122A to 122D (or weights or weighted ends) in the X-axis direction is larger than the width of each of the arm portions 123A to 123D in the X-axis direction. Therefore, the weight per unit length in the Y-axis direction (hereafter, also simply referred to as "weight") of each of the mass-adding portions 122A to 122D is larger than the weight of each of the arm portions 123A to 123D. Thus, the vibration characteristics are improved while reducing the size of the vibrating portion 110. In addition, mass-adding films may be provided on the surfaces of the mass-adding portions 122A to 122D from the viewpoint of increasing the weights of the mass-adding portions 122A to 122D. Such mass-adding films can be used as frequency-adjusting films for adjusting the resonant frequencies of the vibrating arms 121A to 121D by shaving away parts of the mass-adding films.

In a plan view from the top cover 30 side, the protrusion 50, which protrudes from the bottom cover 20, is formed between the arm portions 123B and 123C of the inner vibrating arms 121B and 121C. The protrusion 50 extends in the Y-axis direction that is parallel to the arm portions 123B and 123C. The length of the protrusion 50 in the Y-axis direction is around 240 μm and the length of the protrusion 50 in the X-axis direction is around 15 μm in an exemplary aspect. Bending of the bottom cover 20 is suppressed by formation of the protrusion 50.

(Base 130)

As illustrated in FIG. 3, in a plan view from the top cover 30 side, the base 130 (or base portion) includes the front end portion 131A, a rear end portion 131B, a left end portion 131C, and a right end portion 131D. The front end portion 131A, the rear end portion 131B, the left end portion 131C, and the right end portion 131D are parts of the periphery of the base portion 130. Specifically, the front end portion 131A is an end portion that extends in the X-axis direction on the side near the vibrating arms 121A to 121D. The rear end portion 131B is an end portion that extends in the X-axis direction on the opposite side from the vibrating arms 121A to 121D. The left end portion 131C is an end portion that extends in the Y-axis direction on the side near the vibrating arm 121A when looking from the vibrating arm 121D. The right end portion 131D is an end portion that extends in the Y-axis direction on the side near the vibrating arm 121D when looking from the vibrating arm 121A.

The two ends of the left end portion 131C connect one end of the front end portion 131A and one end of the rear end portion 131B to each other. The two ends of the right end portion 131D connect the other end of the front end portion 131A and the other end of the rear end portion 131B to each other. The front end portion 131A and the rear end portion 131B face each other in the Y-axis direction. The left end portion 131C and the right end portion 131D face each other in the X-axis direction. The vibrating arms 121A to 121D are connected to the front end portion 131A.

In a plan view from the top cover 30 side, the shape of the base 130 is a substantially rectangular shape with the front end portion 131A and the rear end portion 131B forming the long sides and the left end portion 131C and the right end portion 131D forming the short sides. In an exemplary aspect, the base 130 is formed so as to substantially have planar symmetry with respect to a virtual plane P defined along a vertical bisector of the front end portion 131A and the rear end portion 131B. Note that the base 130 is not limited to having a rectangular shape as illustrated in FIG. 3 and may instead have another shape that substantially has planar symmetry with respect to the virtual plane P. For example, the shape of the base 130 may be a trapezoid, with one of the front end portion 131A and the rear end portion 131B being longer than the other. Furthermore, at least one out of the front end portion 131A, the rear end portion 131B, the left end portion 131C, and the right end portion 131D may be bent or curved.

The virtual plane P corresponds to a plane of symmetry of the entire vibrating portion 110. Therefore, the virtual plane P is a plane that passes through the middle of the vibrating arms 121A to 121D in the X-axis direction and is located between the inner vibrating arms 121B and 121C. Specifically, the outer vibrating arm 121A and the inner vibrating arm 121B, which are adjacent to each other, are formed so as to be symmetrical with the outer vibrating arm 121D and the inner vibrating arm 121C, which are adjacent to each other, with the virtual plane P therebetween.

A base length of the base 130, which is the maximum distance between the front end portion 131A and the rear end portion 131B in the Y-axis direction, is around 40 μm, for example. Furthermore, a base width, which is the maximum distance between the left end portion 131C and the right end portion 131D in the X-axis direction, is around 300 μm, for example. In the example configuration illustrated in FIG. 3, the base length corresponds to the length of the left end portion 131C or the right end portion 131D and the base width corresponds to the length of the front end portion 131A or the rear end portion 131B.

(Holding Portion 140)

The holding portion 140 (or frame) is a part for holding the vibrating portion 110 in the vibration space formed by the bottom cover 20 and the top cover 30 and, for example, surrounds the vibrating portion 110. As illustrated in FIG. 3, the holding portion 140 includes a frame front portion 141A, a frame rear portion 141B, a frame left portion 141C, and a frame right portion 141D in a plan view from the side near the top cover 30. The frame front portion 141A, the frame rear portion 141B, the frame left portion 141C, and the frame right portion 141D each form part of a substantially rectangular frame that surrounds the vibrating portion 110. Specifically, the frame front portion 141A is the part that extends in the X-axis direction on the side near the excitation portion 120 when looking from the base portion 130. The frame rear portion 141B is the part that extends in the X-axis direction on the side near the base portion 130 when looking from the excitation portion 120. The frame left portion 141C is the part that extends in the Y-axis direction on the side near the vibrating arm 121A when looking from the vibrating arm 121D. The frame right portion 141D is the part that extends in the Y-axis direction on the side near the vibrating arm 121D when looking from the vibrating arm 121A. The holding portion 140 is formed so as to have planar symmetry with respect to the virtual plane P.

The two ends of the frame left portion 141C are respectively connected to one end of the frame front portion 141A and one end of the frame rear portion 141B. The two ends of the frame right portion 141D are respectively connected to the other end of the frame front portion 141A and the other end of the frame rear portion 141B. The frame front portion 141A and the frame rear portion 141B face each other in the Y-axis direction with the vibrating portion 110 interposed therebetween. The frame left portion 141C and the frame right portion 141D face each other in the X-axis direction with the vibrating portion 110 interposed therebetween. It is noted that it is sufficient that the holding portion 140 be provided along at least part of the periphery of the vibrating portion 110 and the holding portion 140 is not limited to having a continuous peripheral frame shape in alternative aspects.

(Holding Arm 150)

The holding arm 150 is provided inside the holding portion 140 and connects the base 130 to the holding portion 140. As illustrated in FIG. 3, the holding arm 150 includes a left holding arm 151A and a right holding arm 151B in a plan view from the top cover 30 side. The left holding arm 151A connects the rear end portion 131B of the base portion 130 and the frame left portion 141C of the holding portion 140 to each other. The right holding arm 151B connects the rear end portion 131B of the base portion 130 and the frame right portion 141D of the holding portion 140 to each other. The left holding arm 151A includes a holding rear arm 152A and a holding side arm 153A and the right holding arm 151B includes a holding rear arm 152B and a holding side arm 153B. The holding arm 150 is formed so as to have planar symmetry with respect to the virtual plane P.

The holding rear arms 152A and 152B extend from the rear end portion 131B of the base 130 between the rear end portion 131B of the base 130 and the holding portion 140. Specifically, the holding rear arm 152A extends from the rear end portion 131B of the base portion 130 toward the frame rear portion 141B, bends, and then extends toward the frame left portion 141C. The holding rear arm 152B extends from the rear end portion 131B of the base 130 toward the frame rear portion 141B, bends, and then extends toward the frame right portion 141D.

The holding side arm 153A extends parallel to the outer vibrating arm 121A between the outer vibrating arm 121A and the holding portion 140. The holding side arm 153B extends parallel to the outer vibrating arm 121D between the outer vibrating arm 121D and the holding portion 140. Specifically, the holding side arm 153A extends from the frame left portion 141C of the holding portion 140, bends, and then extends toward the frame rear portion 141B and is connected to an end portion of the holding rear arm 152A. The holding side arm 153B extends from the frame right portion 141D of the holding portion 140, bends, and then extends toward the frame rear portion 141B and is connected to an end portion of the holding rear arm 152B.

The holding arm 150 is not limited to having the above-described configuration. For example, the holding arm 150 may be connected to the left end portion 131C and the right end portion 131D of the base portion 130. In addition, the holding arm 150 may be connected to the frame rear portion 141B of the holding portion 140 and may be connected to the frame front portion 141A.

(Multilayer Structure)

Figure 4:
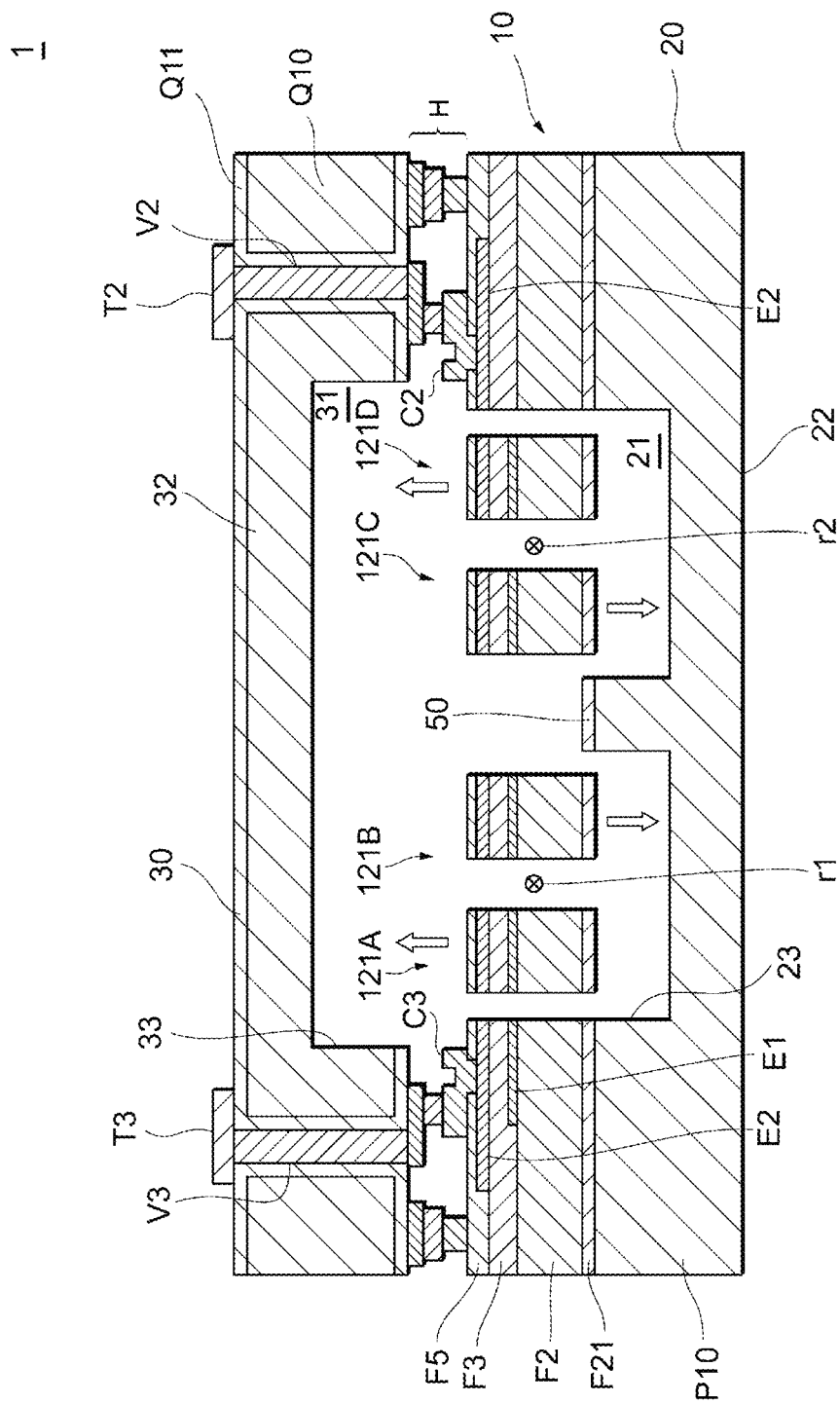
FIG. 4 is a sectional view taken along an X axis conceptually illustrating the multilayer structure of the resonance device illustrated in FIG. 1.
Figure 5:
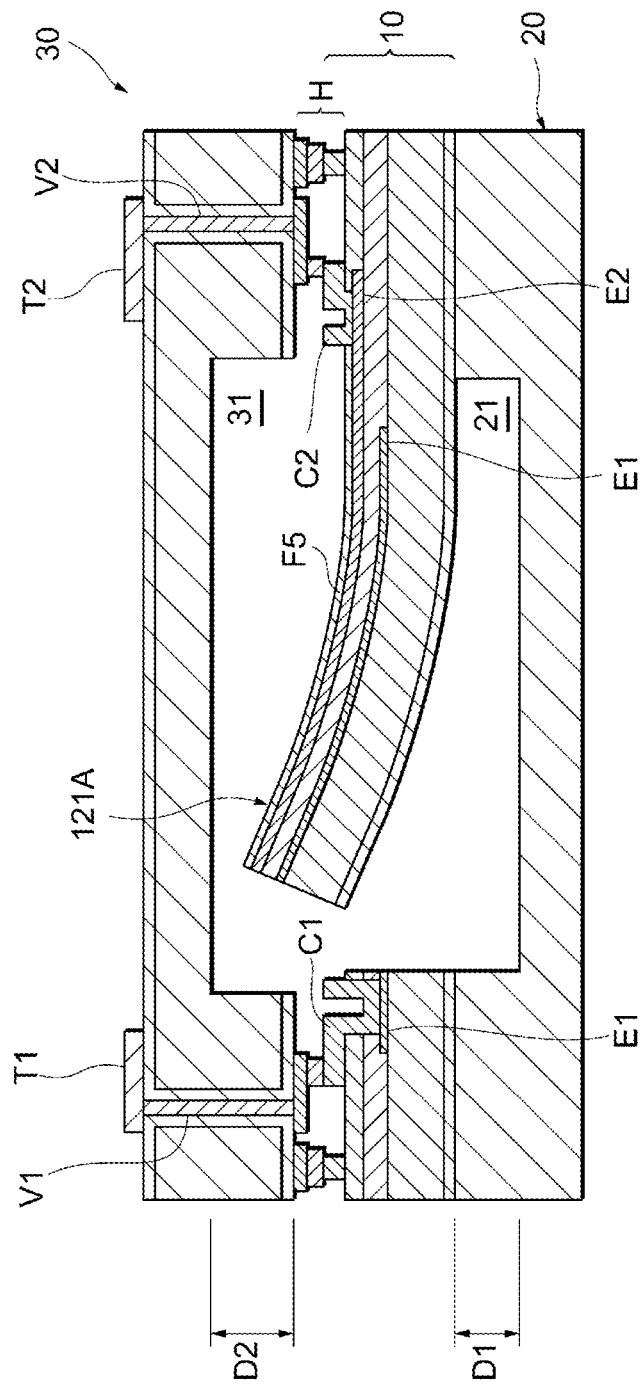
FIG. 5 is a sectional view taken along a Y axis conceptually illustrating the multilayer structure of the resonance device illustrated in FIG. 1 during operation.

Next, the multilayer structure and operation of the resonance device 1 according to the first exemplary embodiment will be described while referring to FIGS. 4 and 5. FIG. 4 is a sectional view taken along the X axis conceptually illustrating the multilayer structure of the resonance device illustrated in FIG. 1. FIG. 5 is a sectional view taken along the Y axis conceptually illustrating the multilayer structure of the resonance device illustrated in FIG. 1 during operation. FIG. 4 simply schematically illustrates a cross section including the mass-adding portions 122A to 122D, lead-out lines C2 and C3, through electrodes V2 and V3, and so forth in order to describe the multilayer structure of the resonance device 1 and these elements are not necessarily located in the same planar cross section. For example, the through electrodes V2 and V3 may be formed at positions that are spaced away in the Y-axis direction from a cross section that is parallel to the ZX plane defined by the Z axis and the X axis and cuts through the mass-adding portions 122A to 122D. Similarly, FIG. 5 simply schematically illustrates a cross section including the vibrating arm 121A, lead-out lines C1 and C2, through electrodes V1 and V2, and so forth in order to describe the multilayer structure of the resonance device 1 and these elements are not necessarily located in the same planar cross section.

In the resonance device 1, the holding portion 140 of the resonator 10 is bonded to the top of the side wall 23 of the bottom cover 20 and furthermore, the holding portion 140 of the resonator 10 and the side wall 33 of the top cover 30 are bonded to each other. Thus, the resonator 10 is held between the bottom cover 20 and the top cover 30 and a vibration space in which the vibrating portion 110 vibrates is formed by the bottom cover 20, the top cover 30, and the holding portion 140 of the resonator 10. The resonator 10, the bottom cover 20, and the top cover 30 are each formed using a silicon (Si) substrate (hereafter, "Si substrate"), for example. The resonator 10, the bottom cover 20, and the top cover 30 may be each formed of a silicon on insulator (SOI) substrate in which a silicon layer and a silicon oxide film are stacked one on top of the other.

(Resonator 10)

The vibrating portion 110, the holding portion 140, and the holding arm 150 of the resonator 10 are integrally formed with each other using the same process. A metal film E1 is stacked on a Si substrate F2, which is an example of a substrate, in the resonator 10. A piezoelectric film F3 is stacked on the metal film E1 so as to cover the metal film E1 and a metal film E2 is stacked on the piezoelectric film F3. A protective film F5 is stacked on the metal film E2 so as to cover the metal film E2. The above-described mass-adding films may be additionally stacked on the protective film F5 in the mass-adding portions 122A to 122D. The vibrating portion 110, the holding portion 140, and the holding arm 150 are formed by subjecting a multilayer body consisting of the above-described Si substrate F2, the metal film E1, the piezoelectric film F3, the metal film E2, the protective film F5, and so on to removal processing and patterning. In the removal processing, for example, the multilayer body is dry etched by radiating an argon (Ar) ion beam in an exemplary aspect. The front surface and the side surface of the resonator 10 where ion beam etching has been performed are charged with the same polarity as a result of being exposed to the charged particles.

The Si substrate F2 can be formed from a degenerate n-type silicon (Si) semiconductor having a thickness of around 6 μm, for example, and can contain phosphorus (P), arsenic (As), antimony (Sb), and the like as n-type dopants. The resistance of the degenerate silicon (Si) used in the Si substrate F2 is, for example, less than 16 mΩ·cm and more preferably is 1.2 mΩ·cm or less. In addition, a temperature characteristic correcting layer F21 composed of a silicon oxide such as SiO2 is formed on the bottom surface of the Si substrate F2. Changes in the resonant frequency of the resonator 10 that occur with changes in the environmental temperature can be reduced as a result of the vibrating portion 110 having the temperature characteristic correcting layer F21. A temperature characteristic correcting layer may be formed on the top surface of the Si substrate F2 or may be formed on both the top surface and the bottom surface of the Si substrate F2.

The temperature characteristic correcting layer F21 of the mass-adding portions 122A to 122D is preferably formed with a uniform thickness. For purposes of this disclosure, a "uniform thickness" means that thickness variations of the temperature characteristic correction layer F21 lie within ±20% of the average value of the thickness.

Moreover, the metal films E1 and E2 each include an excitation electrode for exciting the vibrating arms 121A to 121D and a lead-out electrode for electrically connecting the excitation electrode to an external power source or ground potential. The parts of the metal films E1 and E2 that function as excitation electrodes face each other with the piezoelectric film F3 interposed therebetween in the arm portions 123A to 123D of the vibrating arms 121A to 121D. The parts of the metal films E1 and E2 that function as lead-out electrodes are, for example, led out to the holding portion 140 from the base portion 130 via the holding arm 150. The metal film E1 is electrically continuous throughout the entire resonator 10. The parts of the metal film E2 formed in the outer vibrating arms 121A and 121D and the parts of the metal film E2 formed in the inner vibrating arms 121B and 121C are electrically isolated from each other. The metal film E1 corresponds to a lower electrode and the metal film E2 corresponds to an upper electrode. In an exemplary aspect, the thicknesses of the metal films E1 and E2, for example, lie in a range of around 0.1 to 0.2 μm. The metal films E1 and E2 are patterned into excitation electrodes, lead-out electrodes, and so on by performing a removal process such as etching after film deposition. The metal films E1 and E2 are, for example, formed of a metal material having a body-centered cubic crystal structure. Specifically, the metal films E1 and E2 can be formed using molybdenum (Mo), tungsten (W), or the like.

In addition, the piezoelectric film F3 is a thin film formed of a type of piezoelectric material that converts electrical energy into mechanical energy and vice versa. The piezoelectric thin film F3 expands and contracts in Y-axis directions among in-plane directions of the XY plane in accordance with an electric field formed in the piezoelectric thin film F3 by the metal films E1 and E2. The open ends of the vibrating arms 121A to 121D are displaced toward the inner surfaces of the bottom cover 20 and the top cover 30 by the expansion and contraction of the piezoelectric thin film F3 and the vibrating arms 121A to 121D vibrate in an out-of-plane bending vibration mode.

The piezoelectric film F3 is formed of a material having a wurtzite-type hexagonal crystal structure and for example can have a nitride or an oxide as a main constituent such as aluminum nitride (AlN), scandium aluminum nitride (ScAlN), zinc oxide (ZnO), gallium nitride (GaN), or indium nitride (InN). Scandium aluminum nitride is a substance obtained by replacing some of the aluminum in aluminum nitride with scandium, and instead of scandium, the aluminum may be replaced with two elements such as magnesium (Mg) and niobium (Nb) or magnesium (Mg) and zirconium (Zr). The thickness of the piezoelectric film F3 is, for example, around 1 μm, but may be around 0.2 to 2 μm in variations of the exemplary aspect.

The protective film F5 is constructed to protect the metal film E2 from oxidation. The protective film F5 does not need to be exposed to the bottom plate 32 of the top cover 30 as long as the protective film F5 is provided on the top cover 30 side of the metal film E2. For example, a film that covers the protective film F5 may be formed such as a parasitic capacitance reducing film that reduces the capacitance of a wiring line formed in the resonator 10. The protective film F5 is, for example, formed of a nitride film such as an aluminum nitride (AlN) or silicon nitride ($SiN_x$) film or an oxide film such as an alumina oxide ($Al_2O_3$), tantalum pentoxide ($Ta_2O_5$), or silicon oxide ($SiO_x$) film.

The parts of the protective film F5 provided on the mass-adding portions 122A to 122D may be trimmed using an argon ion beam, for example, in order to adjust the resonant frequency. In this trimming process, the front surface and side surface of the resonator 10 are charged with the same polarity as a result of being exposed to the charged particles. When a mass-adding film is additionally provided on the protective film F5 on the mass-adding portions 122A to 122D, the mass-adding film is preferably formed of a material that is easier to trim than the protective film F5 from the viewpoint of efficiency when the mass-adding film is used as a frequency-adjusting film and the mass-adding film may be a molybdenum (Mo) film, for example. The parts of the protective film F5 provided on the arm portions 123A to 123D are preferably formed with a uniform thickness. For purposes of this disclosure, a "uniform thickness" means that thickness variations of the protective film F5 lie within ±20% of the average value of the thickness.

Lead-out lines C1, C2, and C3 are formed on the protective film F5 of the holding portion 140. The lead-out line C1 is electrically connected to the metal film E1 via a through hole formed in the piezoelectric film F3 and the protective film F5. The lead-out line C2 is electrically connected to parts of the metal film E2 formed on the outer vibrating arms 121A and 121D via through holes formed in the protective film F5. The lead-out line C3 is electrically connected to parts of the metal film E2 formed on the inner vibrating arms 121B and 121C via through holes formed in the protective film F5. The lead-out lines C1 to C3 are formed of a metal material such as aluminum (Al), germanium (Ge), gold (Au), or tin (Sn).

(Bottom Cover 20)

The bottom plate 22 and the side wall 23 of the bottom cover 20 are integrally formed using a Si substrate P10. The Si substrate P10 is formed of non-degenerate silicon and has a resistivity greater than or equal to 10 Ω·cm, for example. The Si substrate P10 is exposed inside the recess 21 of the bottom cover 20. The temperature characteristic correcting layer F21 is formed on the top surface of the protrusion 50. However, from the viewpoint of suppressing charging of the protrusion 50, the Si substrate P10, which has a lower electrical resistivity than the temperature characteristic correcting layer F21, may be exposed at the top surface of the protrusion 50 or a conductive layer may be formed. Moreover, a getter layer can be formed on the surface of the recess 21 of the bottom cover 20 on the side that faces the resonator 10.

The thickness of the bottom cover 20 defined in the Z-axis direction is around 150 µm and a depth D1 of the recess 21, which is defined in the same way, is around 100 µm. The amplitude of the vibrating arms 121A to 121D is restricted by the depth D1 and therefore the maximum amplitude on the side near the bottom cover 20 is around 100 µm.

It is noted that the bottom cover 20 can also be regarded as part of a SOI substrate. If the resonator 10 and the bottom cover 20 are regarded as a MEMS substrate formed by an integrated SOI substrate, the Si substrate P10 of the bottom cover 20 corresponds to a support substrate of the SOI substrate, the temperature characteristic correction layer F21 of the resonator 10 corresponds to a box layer of the SOI substrate, and the Si substrate F2 of the resonator 10 corresponds to an active layer of the SOI substrate. At this time, various semiconductor elements and circuits may be formed using portions of a MEMS substrate that continue outside the resonance device 1.

(Top Cover 30)

The bottom plate 32 and the side wall 33 of the top cover 30 are integrally formed using a Si substrate Q10. It is preferable that the front surface and the rear surface of the top cover 30 and the inner surfaces of the through holes in the top cover 30 be covered by a silicon oxide film Q11. The silicon oxide film Q11 is formed on the front surface of the Si substrate Q10 by oxidizing the Si substrate Q10 or by performing chemical vapor deposition (CVD), for example. The Si substrate Q10 is exposed inside the recess 31 of the top cover 30. A getter layer may be formed on the surface of the recess 31, which is on the side facing the resonator 10, of the top cover 30. The getter layer is, for example, formed of a material having a strong affinity for oxygen such as titanium (Ti), and adsorbs outgas released from a bonding part H and suppresses reduction of the vacuum in the vibration space.

The thickness of the top cover 30 defined in the Z-axis direction is around 150 µm and a depth D2 of the recess 31, which is defined in the same way, is around 100 µm. The amplitude of the vibrating arms 121A to 121D is restricted by the depth D2 and therefore the maximum amplitude on the side near the top cover 30 is around 100 µm.

As shown, terminals T1, T2, and T3 are formed on the top surface of the top cover 30 (i.e., the surface on opposite side from surface facing resonator 10). The terminal T1 is a mounting terminal for grounding the metal film E1. The terminal T2 is a mounting terminal that electrically connects the metal film E2 of the outer vibrating arms 121A and 121D to an external power supply. The terminal T3 is a mounting terminal that electrically connects the metal film E2 of the inner vibrating arms 121B and 121C to an external power supply. Moreover, the terminals T1 to T3 are formed by plating nickel (Ni), gold (Au), silver (Ag), copper (Cu), or the like on a metallized layer (underlying layer) of chromium (Cr), tungsten (W), nickel (Ni), or the like. Dummy terminals, which are electrically insulated from the resonator 10, may be formed on the top surface of the top cover 30 for the purpose of adjusting parasitic capacitances and mechanical strength balance in refinements of the exemplary embodiment.

Through electrodes V1, V2, and V3 are formed inside the side wall 33 of the top cover 30. The through electrode V1 electrically connects the terminal T1 and the lead-out line C1 to each other, the through electrode V2 electrically connects the terminal T2 and the lead-out line C2 to each other, and the through electrode V3 electrically connects the terminal T3 and the lead-out line C3 to each other. The through electrodes V1 to V3 are formed by filling through holes, which penetrate through the side wall 33 of the top cover 30 in the Z-axis direction, with an electrically conductive material. The filled electrically conductive material is, for example, polycrystalline silicon (poly-Si), copper (Cu), gold (Au), or the like.

The bonding part H is formed between the side wall 33 of the top cover 30 and the holding portion 140 in order to bond the side wall 33 of the top cover 30 and the holding portion 140 of the resonator 10 to each other. The bonding part H is formed in a closed ring shape that surrounds the vibrating portion 110 in the XY plane so as to hermetically seal the vibration space of the resonator 10 in a vacuum state. The bonding part H is formed of eutectically bonded metal films, for example, an aluminum (Al) film, a germanium (Ge) film, and an aluminum (Al) film, stacked in this order. The bonding part H may be formed of a combination of films appropriately selected from among gold (Au), tin (Sn), copper (Cu), titanium (Ti), silicon (Si), and the like. In addition, a metallic compound such as titanium nitride (TiN) or tantalum nitride (TaN) may be sandwiched in the bonding part H in order to improve adhesion.

(Operation)

In this exemplary embodiment, the terminal T1 is grounded and alternating current voltages of opposite phases are applied to the terminal T2 and the terminal T3. Therefore, the phase of the electric field formed in the piezoelectric film F3 in the outer vibrating arms 121A and 121D and the phase of the electric field formed in the piezoelectric film F3 in the inner vibrating arms 121B and 121C are opposite phases. This configuration causes the outer vibrating arms 121A and 121D and the inner vibrating arms 121B and 121C to vibrate with opposite phases from each other. For example, when the mass-adding portions 122A and 122D of the outer vibrating arms 121A and 121D are displaced toward the inner surface of the top cover 30, the mass-adding portions 122B and 122C of the inner vibrating arms 121B and 121C are displaced toward the inner surface of the bottom cover 20. As described above, the vibrating arm 121A and the vibrating arm 121B, which are adjacent to each other, vibrate in opposite vertical directions around a center axis r1 that extends in the Y-axis direction between the vibrating arm 121A and the vibrating arm 121B. In addition, the vibrating arm 121C and the vibrating arm 121D, which are adjacent to each other, vibrate in opposite vertical directions around a center axis r2 that extends in the Y-axis direction between the vibrating arm 121C and the vibrating arm 121D. This creates torsional moments in opposite directions at the center axes r1 and r2 and bending vibration is generated in the base portion 130. The maximum amplitude of the vibrating arms 121A to 121D is around 10 µm and the amplitude during normal driving is around 10 µm.

(Details of Vibrating Arms 121A to 121D)

Figure 6:
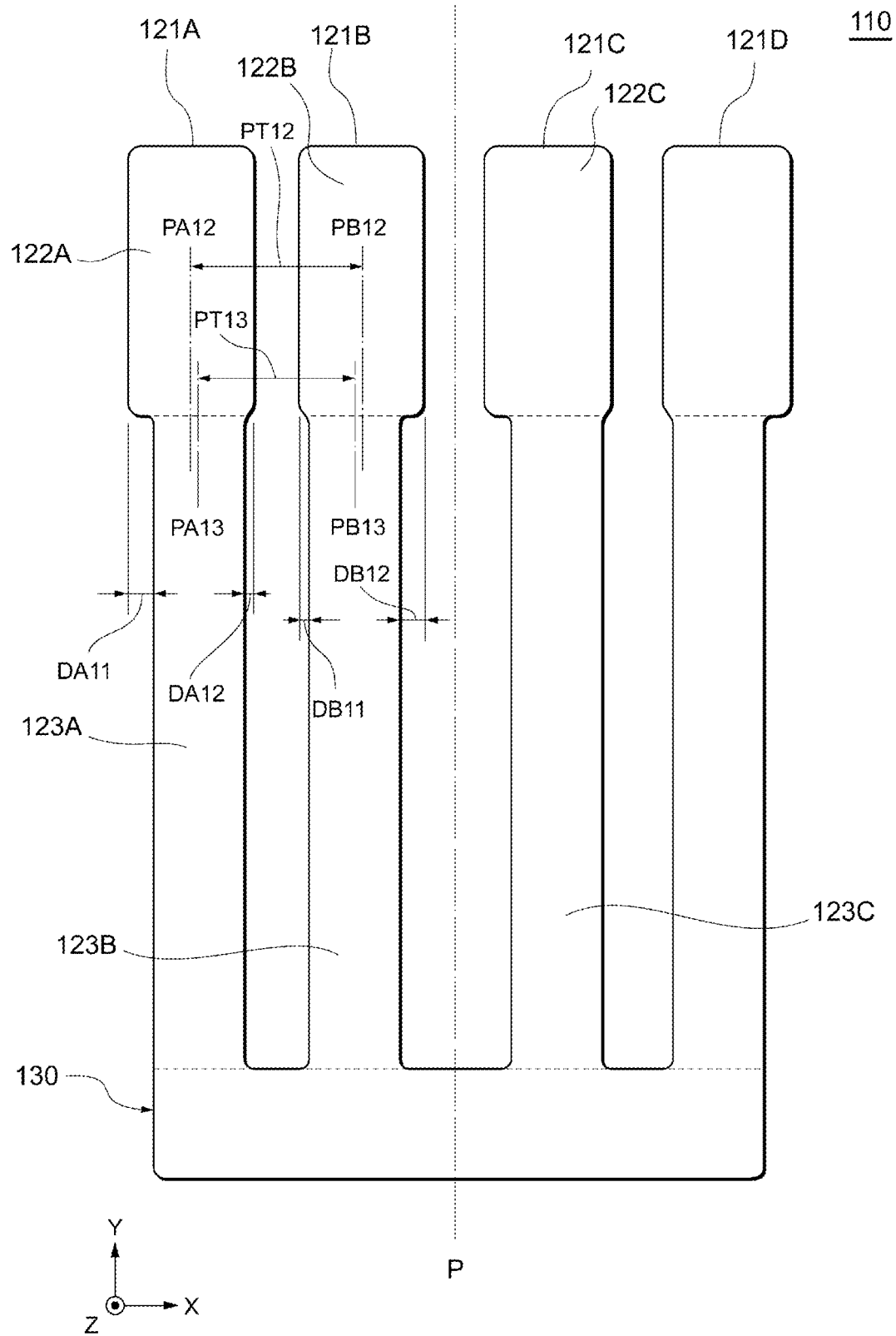
FIG. 6 is a plan view schematically illustrating the structure of a vibrating portion according to the first exemplary embodiment.

Next the detailed configurations of the vibrating arms 121A to 121D will be described while referring to FIG. 6. FIG. 6 is a plan view schematically illustrating the structure of the vibrating portion according to the first exemplary embodiment. Since the structures of the outer vibrating arm 121A and the inner vibrating arm 121B have planar symmetry with the structures of the outer vibrating arm 121D and the inner vibrating arm 121C about the virtual plane P, the configurations of the outer vibrating arm 121A and the inner vibrating arm 121B will be described, but description of the configurations of the outer vibrating arm 121D and the inner vibrating arm 121C will be omitted.

The arm portion 123A of the outer vibrating arm 121A includes a part that has a constant width in the X-axis direction and that extends in the Y-axis direction. For purposes of this disclosure, "constant width" is not limited to the case where the width of the arm portion 123A in the X-axis direction is completely constant, and also includes cases where the width is substantially constant, taking into account variations due to errors caused by the manufacturing process and so forth. In addition, in the example illustrated in FIG. 6, the arm portion 123A extends in the Y-axis direction with a constant width in the X-axis direction in parts except for near the fixed end connected to the base portion 130 and near a connection part connected to the mass-adding portion 122A. In this case, the part near the fixed end of the arm portion 123A that is connected to the base portion 130 and the part near the connection part of the arm portion 123A that is connected to the mass-adding portion 122A both have a rounded and curved shape (for example, so-called R shape) and are slightly wider than the rest of the arm portion 123A. This shape can alleviate the concentration of stress and improve the strength of the vibrating portion 110. The shape of the arm portion 123A is similarly adopted for the arm portions 123B, 123C, and 123D of the inner vibrating arm 121B, the outer vibrating arm 121D, and the inner vibrating arm 121C, as illustrated in FIG. 6. The shape of the arm portions is not limited to this example and the arm portions may instead extend in the Y-axis direction with a constant width at all points including near the connection points to the base portion 130 and the mass-adding portion.

An interval PT12 between the mass-adding portions 122A and 122B is larger than an interval PT13 between the arm portions 123A and 123B. In this embodiment, the interval PT12 between the mass-adding portions 122A and 122B is the distance in the X-axis direction between a center line PA12 that extends in the Y-axis direction and bisects the mass-adding portion 122A in the X-axis direction and a center line PB12 that extends in the Y-axis direction and bisects the mass-adding portion 122B in the X-axis direction. Similarly, the interval PT13 between the arm portion 123A and 123B is the distance in the X-axis direction between a center line PA13 that extends in the Y-axis direction and bisects the arm portion 123A in the X-axis direction and a center line PB13 that extends in the Y-axis direction and bisects the arm portion 123B in the X-axis direction. In the plan view illustrated in FIG. 6, the center line PA12 of the mass-adding portion 122A corresponds to a vertical bisector of the side of the mass-adding portion 122A that includes a connection part between the mass-adding portion 122A and the arm portion 123A and the center line PB12 of the mass-adding portion 122B corresponds to a vertical bisector of the side of the mass-adding portion 122B that includes a connection part between the mass-adding portion 122B and the arm portion 123B. In addition, the center line PB13 of the arm portion 123A corresponds to a vertical bisector of a connection part of the arm portion 123A with the mass-adding portion 122A and the center line PB13 of the arm portion 123B corresponds to a vertical bisector of a connection part of the arm portion 123B with the mass-adding portion 122B.

The mass-adding portion 122A of the outer vibrating arm 121A is shifted from the center of the arm portion 123A in a direction that intersects the extension direction of the vibrating arms 121A to 121D away from the inner vibrating arm 121B. In other words, the center line PA12 of the mass-adding portion 122A is farther away from the inner vibrating arm 121B than the center line PA13 of the arm portion 123A. In addition, a protruding width DA12 of the mass-adding portion 122A of the outer vibrating arm 121A on the side near the inner vibrating arm 121B is smaller than a protruding width DA11 on the opposite side.

For example, the protruding width DA12 corresponds to the maximum value of the distance in the X-axis direction between the end portion (or side surface) of the mass-adding portion 122A that extends in the Y-axis direction and the end portion (or side surface) of the arm portion 123A that extends in the Y-axis direction on the side of the outer vibrating arm 121A nearer the inner vibrating arm 121B. In addition, the protruding width DA11 corresponds to the maximum value of the distance in the X-axis direction between the end portion of the mass-adding portion 122A that extends in the Y-axis direction and the end portion of the arm portion 123A that extends in the Y-axis direction on the side of the outer vibrating arm 121A on the opposite side from the inner vibrating arm 121B.

The mass-adding portion 122B of the inner vibrating arm 121B is shifted from the center of the arm portion 123B in a direction that intersects the extension direction of the vibrating arms 121A to 121D so as to be spaced away from the outer vibrating arm 121A. In other words, the center line PB12 of the mass-adding portion 122B is farther away from the outer vibrating arm 121A than the center line PB13 of the arm portion 123B. In addition, a protruding width DB11 of the mass-adding portion 122B of the inner vibrating arm 121B on the side near the outer vibrating arm 121A is smaller than a protruding width DB12 on the opposite side. Thus, the center lines PA12, PA13, PB13, and PB12 are arrayed in this order in the X-axis direction.

For example, the protruding width DB11 corresponds to the maximum value of the distance in the X-axis direction between the end portion of the mass-adding portion 122B that extends in the Y-axis direction and the end portion of the arm portion 123B that extends in the Y-axis direction on the side of the inner vibrating arm 121B near the outer vibrating arm 121A. In addition, the protruding width DB12 corresponds to the maximum value of the distance in the X-axis direction between the end portion of the mass-adding portion 122B that extends in the Y-axis direction and the end portion of the arm portion 123B that extends in the Y-axis direction on the side of the inner vibrating arm 121B on the opposite side from the outer vibrating arm 121A.

As described above, in this embodiment, the mass-adding portions 122A and 122B of the outer vibrating arm 121A and the inner vibrating arm 121B, which are adjacent to each other and vibrate with opposite phases, are provided so as to be shifted away from each other in the X-axis direction. Specifically, the interval PT12 between the center lines of the mass-adding portions 122A and 122B is larger than the interval PT13 between the center lines of the arm portions 123A and 123B. This configuration provides the mass-adding portions 122A and 122B to be spaced away from each other. Insulators and conductors on the surfaces of or between the layers of the outer vibrating arm 121A and the inner vibrating arm 121B are charged due to ion beam exposure in the etching and trimming processes, a pyroelectric effect due to temperature changes in the manufacturing process and operating environment, and so forth. This charging may result in the outer vibrating arm 121A and the inner vibrating arm 121B exerting Coulomb forces on each other. The mass-adding portions 122A and 122B are more easily displaced than the arm portions 123A and 123B of the outer vibrating arm 121A and the inner vibrating arm 121B and are more likely to be affected by Coulomb forces. Therefore, changes in the vibration paths of the outer vibrating arm 121A and the inner vibrating arm 121B can be suppressed and variations in the resonant frequency can be suppressed by arranging the mass-adding portions 122A and 122B so as to be spaced apart from each other. In particular, variations in resonant frequency caused by Coulomb forces can be suppressed even in a configuration in which the release width W1 between the arm portions 123B and 123C of the inner vibrating arms 121B and 121C is large and the release width W2 between the arm portions 123A and 123B of the outer vibrating arm 121A and the inner vibrating arm 121B, which are adjacent to each other, is small, from the viewpoint of improving vibration characteristics.

Since the inner vibrating arms 121B and 121C are vibrating arms that vibrate with the same phase, changes in the vibration paths of the inner vibrating arms 121B and 121C caused by the inner vibrating arms 121B and 121C applying Coulomb forces to each other are smaller than changes in the vibration paths of the outer vibrating arm 121A and the inner vibrating arm 121B, which are adjacent to each other, caused by the outer vibrating arm 121A and the inner vibrating arm 121B applying Coulomb forces to each other. Therefore, changes in resonant frequency are small even when the mass-adding portions 122B and 122C of the inner vibrating arms 121B and 121C are shifted from the centers of the arm portions 123B and 123C so as to be closer to each other.

Hereafter, the configurations of mass-adding portions of vibrating arms according to another exemplary embodiment will be described. In the following embodiment, description of matters common to the first embodiment is omitted and only the differences are described. In particular, the same operational effects resulting from the same configurations are not repeatedly described.

Second Exemplary Embodiment

Figure 7:
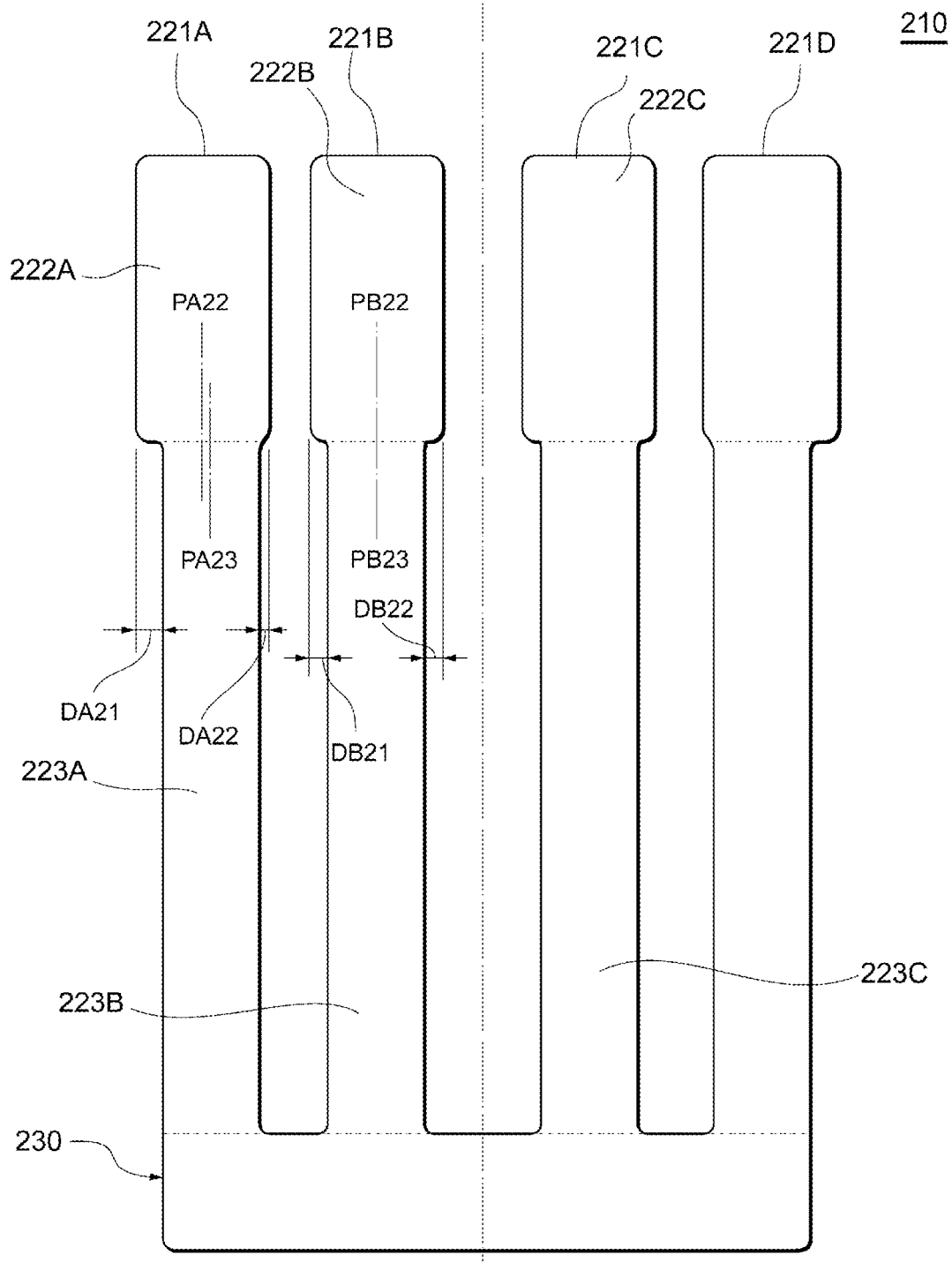
FIG. 7 is a plan view schematically illustrating the structure of a vibrating portion according to a second exemplary embodiment.

Next, a vibrating portion 210 of a resonator according to a second embodiment will be described while referring to FIG. 7. FIG. 7 is a plan view schematically illustrating the structure of the vibrating portion according to the second exemplary embodiment. Similarly to the vibrating portion 110 according to the first embodiment, the vibrating portion 210 according to the second embodiment includes a base 230 and vibrating arms 221A to 221D. The structures of the outer vibrating arm 221A and the inner vibrating arm 221B have planar symmetry with the structures of the outer vibrating arm 221D and the inner vibrating arm 221C with respect to the virtual plane P, and therefore description of the configurations of the outer vibrating arm 221D and the inner vibrating arm 221C will be omitted.

A difference from the first embodiment is that only a mass-adding portion 222A of the outer vibrating arm 221A, out of the outer vibrating arm 221A and the inner vibrating arm 221B, is shifted from the center of an arm portion 223A of the outer vibrating arm 221A relative to the X-axis direction. In other words, a center line PA22 of the mass-adding portion 222A of the outer vibrating arm 221A, a center line PA23 of the arm portion 223A of the outer vibrating arm 221A, and a center line PB22 of a mass-adding portion 222B of the inner vibrating arm 221B are arrayed in this order and the center line PB22 of the mass-adding portion 222B and a center line PB23 of an arm portion 223B of the inner vibrating arm 221B substantially overlap each other. In addition, a protruding width DA22 of the mass-adding portion 222A of the outer vibrating arm 221A on the side near the inner vibrating arm 221B is smaller than a protruding width DA21 on the opposite side, whereas a protruding width DB21 of the mass-adding portion 222B of the inner vibrating arm 221B on the side near the outer vibrating arm 221A is substantially equal to a protruding width DB22 on the opposite side.

With this configuration, the mass-adding portions 222A and 222B of the outer vibrating arm 221A and the inner vibrating arm 221B, which are adjacent to each other, are arranged so as to be spaced away from each other even when the inner vibrating arms 221B and 221C are close to each other due to size reduction of the vibrating portion 210 and space cannot be secured by shifting the mass-adding portions 222B and 222C closer to each other from the centers of the arm portions 223B and 223C.

Third Exemplary Embodiment

Figure 8:
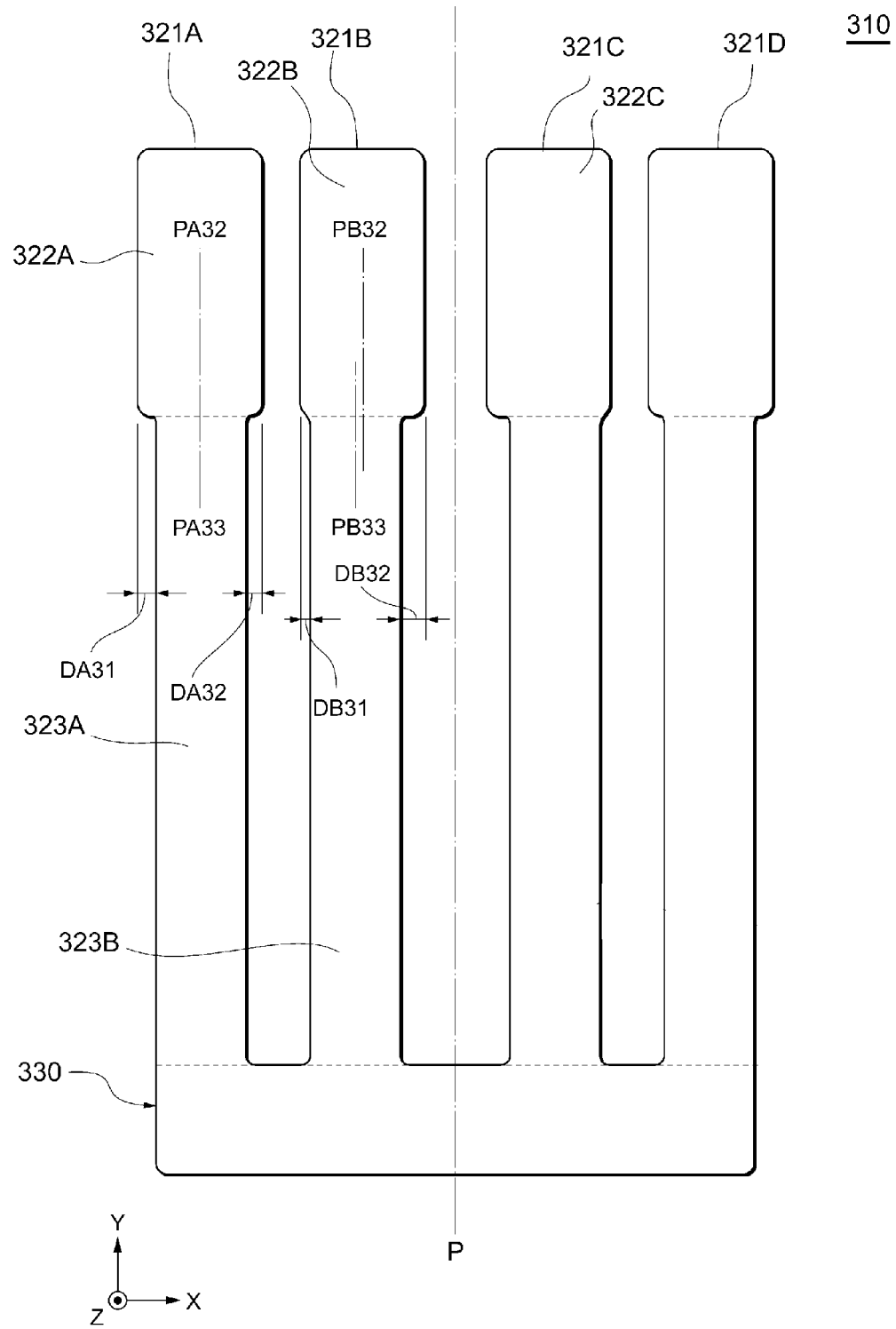
FIG. 8 is a plan view schematically illustrating the structure of a vibrating portion according to a third exemplary embodiment.

Next, a vibrating portion 310 of a resonator according to a third embodiment will be described while referring to FIG. 8. FIG. 8 is a plan view schematically illustrating the structure of the vibrating portion according to the third exemplary embodiment. Similarly to the vibrating portion 110 according to the first embodiment, the vibrating portion 310 according to the third embodiment includes a base 330 and vibrating arms 321A to 321D. The structures of the outer vibrating arm 321A and the inner vibrating arm 321B have planar symmetry with the structures of the outer vibrating arm 321D and the inner vibrating arm 321C with respect to the virtual plane P, and therefore description of the configurations of the outer vibrating arm 321D and the inner vibrating arm 321C will be omitted.

A difference from the first embodiment is that only a mass-adding portion 322B of the inner vibrating arm 321B, out of the outer vibrating arm 321A and the inner vibrating arm 321B, is shifted from the center of an arm portion 323B of the inner vibrating arm 321B relative to the X-axis direction. In other words, a center line PA32 of a mass-adding portion 322A of the outer vibrating arm 321A, a center line PB33 of the arm portion 323B of the inner vibrating arm 321B, and a center line PB32 of the mass-adding portion 322B of the inner vibrating arm 321B are arrayed in this order and the center line PA32 of the mass-adding portion 322A and a center line PA33 of an arm portion 323A of the outer vibrating arm 321A substantially overlap each other. In addition, a protruding width DB31 of the mass-adding portion 322B of the inner vibrating arm 321B on the side near the outer vibrating arm 321A is smaller than a protruding width DB32 on the opposite side, whereas a protruding width DA32 of the mass-adding portion 322A of the outer vibrating arm 321A on the side near the inner vibrating arm 321B is substantially equal to a protruding width DA31 on the opposite side.

According to this configuration, the space formed between the mass-adding portions 322B and 322C of the inner vibrating arms 321B and 321C can be effectively utilized when the inner vibrating arms 321B and 321C are provided so as to be spaced apart from each other with the aim of improving the vibration characteristics. For example, even in the case where a space cannot be secured by shifting the mass-adding portion 322A of the outer vibrating arm 321A in a direction away from the inner vibrating arm 321B due to size reduction of the resonator, the mass-adding portions 322A and 322B of the outer vibrating arm 321A and the inner vibrating arm 321B, which are adjacent to each other, can be arranged so as to be spaced away from each other.

Fourth Exemplary Embodiment

Figure 9:
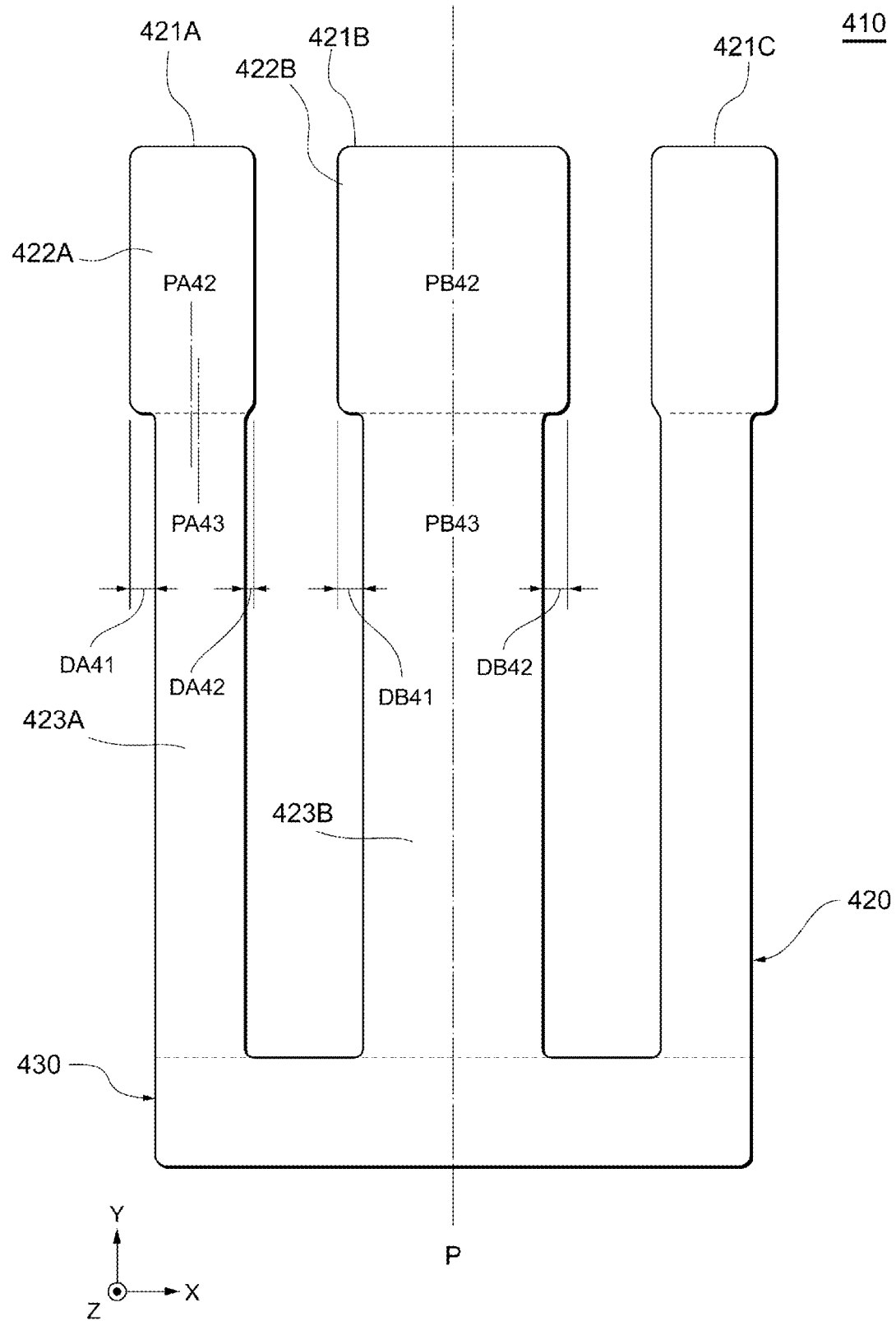
FIG. 9 is a plan view schematically illustrating the structure of a vibrating portion according to a fourth exemplary embodiment.

Next, a vibrating portion 410 of a resonator according to a fourth embodiment will be described while referring to FIG. 9. FIG. 9 is a plan view schematically illustrating the structure of the vibrating portion according to the fourth exemplary embodiment.

A difference from the first embodiment is that an excitation portion 420 connected to a base 430 only incudes three vibrating arms 421A to 421C, with the inner vibrating arm 421B being adjacent to both the outer vibrating arms 421A and 421C and disposed therebetween. A virtual plane P passes through the center of the inner vibrating arm 421B relative to the Y-axis direction. The outer vibrating arms 421A and 421C are formed so as to be symmetrical with each other about the virtual plane P, and therefore description of the configuration of the outer vibrating arm 421C will be omitted.

A mass-adding portion 422A of the outer vibrating arm 421A is shifted from the center of an arm portion 423A of the outer vibrating arm 421A in a direction away from the inner vibrating arm 421B (i.e., in the X-axis direction). In other words, a center line PA42 of the mass-adding portion 422A of the outer vibrating arm 421A, a center line PA43 of the arm portion 423A of the outer vibrating arm 421A, and a center line PB42 of a mass-adding portion 422B of the inner vibrating arm 421B are arrayed in this order. The center line PB42 of the mass-adding portion 422B and a center line PB43 of an arm portion 423B of the inner vibrating arm 421B substantially overlap each other and are located within the plane of the virtual plane P. In addition, a protruding width DA42 of the mass-adding portion 422A of the outer vibrating arm 421A on the side near the inner vibrating arm 421B is smaller than a protruding width DA41 on the opposite side, whereas a protruding width DB41 of the mass-adding portion 422B of the inner vibrating arm 421B on the side near the outer vibrating arm 421A is substantially equal to a protruding width DB42 on the opposite side.

An exemplary aspect of the present invention provides a resonator that includes a base; and at least three vibrating arms that include a piezoelectric film and an upper electrode and a lower electrode that are provided so as to face each other with the piezoelectric film interposed therebetween. Moreover, first ends of the vibrating arms are fixed ends connected to a front end portion of the base and second ends of the vibrating arms being open ends provided so as to be spaced away from the front end portion. Each vibrating arm among the at least three vibrating arms includes an arm portion having a part that extends from the fixed end in a direction toward the open end with a constant width and a mass-adding portion that is connected to a tip of the arm portion and has a larger width than the arm portion. An interval between the mass-adding portions is larger than an interval between the arm portions for any two of the vibrating arms, among the at least three vibrating arms, that are adjacent to each other and vibrate with opposite phases.

With this configuration, changes in the vibration paths of an outer vibrating arm and an inner vibrating arm can be suppressed and variations in resonant frequency can be suppressed as a result of the mass-adding portions being spaced away from each other.

In particular, variations in resonant frequency caused by the effect of Coulomb forces can be suppressed even in a configuration in which the release width between the arm portions of inner vibrating arms is large and the release width between the arm portions of an outer vibrating arm and an inner vibrating arm, which are adjacent to each other, is small from the viewpoint of improving vibration characteristics.

In particular, in the case where the arm portions extend with a constant width in all parts except for near the fixed ends connected to the base portion and near connection parts connected to the mass-adding portions, reduction of mechanical strength and concentration of stress can be prevented in parts other than near the fixed ends of the arm portions and near the connection parts. Furthermore, in the case where the parts of the arm portions near the fixed ends and near the connection parts both have a rounded and curved shape and have a slightly larger width than the other parts of the arm portions, reduction of the mechanical strength and concentration of stress in the parts of the arm portions near the fixed ends and near the connection parts can be prevented.

As one preferred aspect, the at least three vibrating arms include two outer vibrating arms arranged on the outside and one or two inner vibrating arms arranged on the inside and are configured so that the outer vibrating arms and the inner vibrating arms vibrate with opposite phases from each other.

As one preferred aspect, the mass-adding portions of the outer vibrating arms are shifted from centers of the arm portions of the outer vibrating arms in directions that intersect an extension direction of the vibrating arms so as to be spaced away from the inner vibrating arms.

According to this configuration, the mass-adding portions of an outer vibrating arm and an inner vibrating arm, which are adjacent to each other, can be spaced away from each other even in a case where the inner vibrating arms are close to each other due to size reduction of the vibrating portion and space cannot be secured by shifting the mass-adding portions closer to each other from the centers of the arm portions.

As one preferred aspect, the mass-adding portions of the inner vibrating arms are shifted from centers of the arm portions of the inner vibrating arms in directions that intersect an extension direction of the vibrating arms so as to be spaced away from the outer vibrating arms.

According to this configuration, a space formed between the mass-adding portions of the inner vibrating arms can be effectively utilized when the inner vibrating arms are provided so as to be spaced apart from each other with the aim of improving vibration characteristics. For example, even in the case where a space cannot be secured by shifting the mass-adding portions of the outer vibrating arms in directions away from the inner vibrating arms due to size reduction of the resonator, the mass-adding portions of the outer vibrating arms and the inner vibrating arms, which are adjacent to each other, can be spaced apart from each other.

In an exemplary aspect, a resonance device is provided that includes any of the above-described resonators; a bottom cover that is bonded to the resonator; and a top cover that is bonded to the bottom cover with the resonator interposed therebetween and that forms, together with the bottom cover, a vibration space in which the at least three vibrating arms vibrate.

As described above, according to exemplary aspects of the present invention, a resonator is provide that suppresses variations in resonant frequency without compromising mechanical strength. Moreover, a resonance device is provided that includes the resonator.

The embodiments described above provided for an easy understanding of the present invention and the embodiments are not to be interpreted as limiting the present invention. The present invention can be modified or improved without departing from the gist of the invention and equivalents to the present invention are also included in the present invention. In other words, appropriate design changes made to the embodiments by one skilled in the art are included in the scope of the present invention so long as the changes have the characteristics of the present invention. For example, the elements included in the embodiments and the arrangements, materials, conditions, shapes, sizes and so forth of the elements are not limited to those exemplified in the embodiments and can be changed as appropriate. In addition, the elements included in the embodiments can be combined as much as technically possible and such combined elements are also included in the scope of the present invention so long as the combined elements have the characteristics of the present invention.

REFERENCE SIGNS LIST

1 . . . resonance device
9 . . . particle
10 . . . resonator
20 . . . bottom cover
30 . . . top cover
21, 31 . . . recess
22, 32 . . . bottom plate
23, 33 . . . side wall
110 . . . vibrating portion
121A to 121D . . . vibrating arm
122A to 122D . . . mass-adding portion
123A to 123D . . . arm portion
130 . . . base portion
131A . . . front end portion
131B . . . rear end portion
131C . . . left end portion
131D . . . right end portion
140 . . . holding portion
141A . . . frame front portion
141B . . . frame rear portion
141C . . . frame left portion
141D . . . frame right portion
150 . . . holding arm
151A . . . left holding arm
151B . . . right holding arm
152A, 152B . . . holding rear arm
153A, 153B . . . holding side arm
F2 . . . Si substrate
F21 . . . temperature characteristic correcting layer
F3 . . . piezoelectric film
F5 . . . protective film
E1, E2 . . . metal film (lower electrode, upper electrode)

The invention claimed is:

1. A resonator comprising:
a base; and
at least three vibrating arms that include an upper electrode and a lower electrode that face each other with a piezoelectric film interposed therebetween, with each of the at least three vibrating arms having fixed ends connected to a front end of the base and open ends be spaced away from the front end,
wherein each of the at least three vibrating arms includes an arm portion that has a constant width and that extends from the fixed end in a direction towards the open end and a mass-adding portion that is connected to a tip of the arm portion and has a width larger than the width of the arm portion, and
wherein an interval between the mass-adding portions is larger than an interval between the arm portions for any two of the at least three vibrating arms that are adjacent to each other and that are constructed to vibrate in opposite phases from each other.

2. The resonator according to claim 1, wherein the width of the mass-adding portions of each of the at least three vibrating arms is a constant width for a length of each mass adding portion.

3. The resonator according to claim 1, wherein the at least three vibrating arms comprise two outer vibrating arms and at least one inner vibrating arm disposed between the two outer vibrating arms, with the outer vibrating arms constructed to vibrate in an opposite phase from the at least one inner vibrating arm.

4. The resonator according to claim 3, wherein the mass-adding portions of the two outer vibrating arms are shifted from center lines of the arm portions of the two outer vibrating arms in a direction perpendicular to a direction in which the at least three vibrating arms extend, such that the two outer vibrating arms are spaced away from the at least one inner vibrating arm.

5. The resonator according to claim 4, wherein the respective mass-adding portion of the at least one inner vibrating arm is shifted from a respective center line of the arm portion of the at least one inner vibrating arm in the direction perpendicular to the direction in which the at least three vibrating arms extend, such that the at least one inner vibrating arm is spaced away from the two outer vibrating arms.

6. The resonator according to claim 1, wherein the at least three vibrating arms extend in a lengthwise direction and the widths of the respective arm portions and the mass-adding portions extend in a widthwise direction that is perpendicular to the lengthwise direction.

7. The resonator according to claim 6,
wherein first center lines in the lengthwise direction bisect each of the mass-adding portions of each of the at least three vibrating arms and second center lines in the lengthwise direction bisect each of the arm portions of each of the at least three vibrating arms, and
wherein the interval between the mass-adding portions is a distance between the respective first center lines and the interval between the arm portions is a distance between the respective second center lines of the two vibrating arms that are adjacent to each other.

8. A resonator comprising:
a base; and
at least three vibrating arms that each have a fixed end connected to a front end of the base and an open end that is opposite the fixed end, wherein each of the at least three vibrating arms includes an arm portion with a constant width that extends from the fixed end and a mass-adding portion disposed on the open end thereof and having a width larger than the width of the arm portion, and wherein an interval between respective centers of the mass-adding portions is larger than an interval between respective centers of the arm portions for any two of the at least three vibrating arms that are adjacent to each other.

9. The resonator according to claim 8, wherein each of the at least three vibrating arms includes an upper electrode and a lower electrode that face each other with a piezoelectric film interposed therebetween, and the two vibrating arms that are adjacent to each other are constructed to vibrate in opposite phases from one another.

10. The resonator according to claim 8, wherein the width of the mass-adding portions of each of the at least three vibrating arms is a constant width for a length of each mass adding portion.

11. The resonator according to claim 8, wherein the at least three vibrating arms comprise two outer vibrating arms and at least one inner vibrating arm disposed between the two outer vibrating arms, with the outer vibrating arms constructed to vibrate in an opposite phase from the at least one inner vibrating arm.

12. The resonator according to claim 11, wherein the mass-adding portions of the two outer vibrating arms are shifted from center lines of the arm portions of the two outer vibrating arms in a direction perpendicular to a direction in which the at least three vibrating arms extend, such that the two outer vibrating arms are spaced away from the at least one inner vibrating arm.

13. The resonator according to claim 12, wherein the respective mass-adding portion of the at least one inner vibrating arm is shifted from a respective center line of the arm portion of the at least one inner vibrating arm in the direction perpendicular to the direction in which the at least three vibrating arms extend, such that the at least one inner vibrating arm is spaced away from the two outer vibrating arms.

14. The resonator according to claim 8, wherein the at least three vibrating arms extend in a lengthwise direction and the widths of the respective arm portions and the mass-adding portions extend in a widthwise direction that is perpendicular to the lengthwise direction.

15. The resonator according to claim 14,
wherein first center lines in the lengthwise direction bisect each of the mass-adding portions of each of the at least three vibrating arms and second center lines in the lengthwise direction bisect each of the arm portions of each of the at least three vibrating arms, and
wherein the interval between the mass-adding portions is a distance between the respective first center lines and the interval between the arm portions is a distance between the respective second center lines of the two vibrating arms that are adjacent to each other.

16. A resonator comprising:
a base; and
at least three vibrating arms extending parallel to each other and in a lengthwise direction from the base, with the at least three vibrating arms having two outer vibrating arms and at least one inner vibrating arm disposed therebetween,
wherein each of the at least three vibrating arms includes an arm portion with a constant width that is perpendicular to the lengthwise direction,
wherein each of the at least three vibrating arms includes mass-adding portion disposed on a free end thereof with the respective mass-adding portions having a width larger than the width of the respective arm portions, and
wherein first center lines in the lengthwise direction bisect each of the mass-adding portions and second center lines in the lengthwise direction bisect each of the arm portions, and
wherein an interval between the respective first center lines of one of the outer vibrating arms and the at least one inner vibrating arm is great than an interval between the respective second center lines of the one outer vibrating arm and the at least one inner vibrating arm.

17. The resonator according to claim 16, wherein each of the at least three vibrating arms includes an upper electrode and a lower electrode that face each other with a piezoelectric film interposed therebetween, and the two outer vibrating arms are constructed to vibrate in opposite phases from the at least one inner vibrating arm.

18. The resonator according to claim 16, wherein the mass-adding portions of the two outer vibrating arms are shifted from the second center lines of the arm portions of the two outer vibrating arms in direction perpendicular to the lengthwise direction in which the at least three vibrating arms extend, such that the two outer vibrating arms are spaced away from the at least one inner vibrating arm.

19. The resonator according to claim 18, wherein the respective mass-adding portion of the at least one inner vibrating arm is shifted from the respective second center line of the arm portion of the at least one inner vibrating arm in the direction perpendicular to the lengthwise direction in which the at least three vibrating arms extend, such that the at least one inner vibrating arm is spaced away from the two outer vibrating arms.

20. A resonance device comprising:
the resonator according to claim 1;
a bottom cover that is bonded to the resonator; and
a top cover that is bonded to the bottom cover with the resonator interposed therebetween,
wherein the top cover and the bottom cover define a vibration space in which the at least three vibrating arms vibrate.

* * * * *